(12) United States Patent
Kang (10) Patent No.: US 6,188,621 B1
(45) Date of Patent: Feb. 13, 2001

(54) TEST CIRCUIT FOR FLASH MEMORY DEVICE AND METHOD THEREOF

(75) Inventor: Hyeok Kang, Kyungki-Do (KR)

(73) Assignee: Hyundai Electroncis Industries Co., Ltd., Kyungki-Do (KR)

( * ) Notice: Under 35 U.S.C. 154(b), the term of this patent shall be extended for 0 days.

(21) Appl. No.: 09/466,242

(22) Filed: Dec. 22, 1999

(30) Foreign Application Priority Data

Dec. 23, 1998 (KR) .................................................. 98-57718

(51) Int. Cl.$^7$ .................................................. G11C 29/00
(52) U.S. Cl. .................. 365/201; 365/238.5; 365/185.33
(58) Field of Search .................................. 365/201, 218, 365/238.5, 191, 185.33

(56) References Cited

U.S. PATENT DOCUMENTS

| 5,448,577 | 9/1995 | Wells et al. . | |
|---|---|---|---|
| 5,561,628 | * 10/1996 | Terada et al. | 365/185.04 |
| 5,627,838 | 5/1997 | Lin et al. . | |
| 5,751,944 | 5/1998 | Roohparvar et al. . | |
| 5,818,848 | 10/1998 | Lin et al. . | |
| 6,052,321 | * 4/2000 | Roohparvar | 365/201 |

FOREIGN PATENT DOCUMENTS

| 7-218599 | 8/1995 | (JP) . |
|---|---|---|
| 8-96600 | 4/1996 | (JP) . |
| 10-83700 | 3/1998 | (JP) . |

* cited by examiner

Primary Examiner—David Nelms
Assistant Examiner—Thong Le
(74) Attorney, Agent, or Firm—Pennie & Edmonds LLP (57) ABSTRACT

There is disclosed a test circuit for a flash memory device and method thereof, which comprises a byte program means for performing a byte program according to a byte program enable signal and a cell address signal and outputting the last address signal of a sector, a program fail signal and an address signal of the fail cell; a chip erase means for performing a chip erase operation according to an erase enable signal and said sector address signal and for outputting an erase fail signal and an address signal of a fail sector; a sector address increment means for increasing a sector address according to said sector address signal and outputting the last sector address signal; a first means for generating a test signal according to the test enable signal, said last sector address signal, a test erase enable signal, said program fail signal and said erase fail signal; a second means for generating a test program enable signal or a test erase enable signal according to the last sector address signal and the test signal to supply them to said byte program means or said chip erase means; and an address/sector decoder for decoding the address from an address pad into a cell address and a sector address to supply them said byte program means and said chip erase means, respectively.

6 Claims, 6 Drawing Sheets

TEST CIRCUIT FOR FLASH MEMORY DEVICE AND METHOD THEREOF

FIELD OF THE INVENTION

The present invention relates to a test circuit for a flash memory device and method thereof. In particular, the present invention relates to a test circuit for a flash memory device and method thereof, which allow circuits therein to be designed in consideration of the test process during the design process of a flash memory device so that the test mode of the flash memory device can be automatically repeated without manipulation and command by the operator when a specific voltage is applied to its external pins, thereby reducing the costs and time necessary to test it.

DESCRIPTION OF THE PRIOR ART

In designing an electronic circuit, the problem of reliability test on a device becomes an integral part. This is because unexpected variables such as temperature, external voltage etc. become increased due to higher integration and ultra micro-miniature process of the device and it also becomes important to manufacture reliable products in a short development period in designing an electronic circuit. Thus, the circuit design to facilitate the test must be considered at the early stage of developing the products, which is important not inferior to designing the products.

The test process for securing reliability of the flash memory commonly proceeds as follows. First, it checks whether programming into the entire sectors except for the protected sector in the chip is successfully accomplished or not. In order to accomplish this, it performs a byte program into the entire addresses for the entire sectors that are not protected. If this process is completed, it checks whether there is any fail in the chip by performing erase process. At this time, the erase process for the entire sectors must be performed for the entire sectors that are not protected, as in the programming. As above, via repeated programming and erase process, if it can be secured that no fail are found therein, reliability of the chip can be secured. During this process, the extracted fail chips are repaired or discarded.

In a conventional method, it checks the fail by performing a programming on individual sectors and erasing it again. Thus, there is a problem in that it requires a lot of costs and time to complete the test on the entire sectors. Also, there will be the case, to an extreme, in which the cost required to test a lot of chips is comparable to that required to design the products, which cause to lower the efficiency of the test process.

SUMMARY OF THE INVENTION

It is an object of the present invention to solve the problems involved in the prior art, and to provide a test circuit and method thereof by which the program and erase process can be automatically connected by designing the circuit in consideration of test during the design process of a product and the test mode can be also finished depending on the fail flag when any fail is found within a chip during a specific cycle, thus reducing the entire period necessary to develop the product and the costs and time necessary to test it.

To achieve the above object, a test circuit for a flash memory device according to the present invention is characterized in that it comprises a byte program means for performing a byte program according to a byte program enable signal and a cell address signal and outputting the last address signal of a sector, a program fail signal and an address signal of the fail cell; a chip erase means for performing a chip erase operation according to an erase enable signal and said sector address signal and for outputting an erase fail signal and an address signal of a fail sector; a sector address increment means for increasing a sector address according to said sector address signal and outputting the last sector address signal; a first means for generating a test signal according to the test enable signal, said last sector address signal, a test erase enable signal, said program fail signal and said erase fail signal; a second means for generating a test program enable signal or a test erase enable signal according to the last sector address signal and the test signal to supply them to said byte program means or said chip erase means; and an address/sector decoder for decoding the address from an address pad into a cell address and a sector address to supply them said byte program means and said chip erase means, respectively.

Also, a method of testing a flash memory device according to the present invention is characterized in that it comprises the steps of confirming whether the current sector has been protected or not as the test mode begins, if it has been protected, checking whether it is the last address of the sector or not, and if not performing a byte programming operation, if any fail occurs during the byte programming operation, finishing the test mode, and if it is not, checking whether the address in programming is the last address of the sector, and if it is not the last address of the sector, proceeding to the step to check whether the sector has been protected, and if it is the last address of the sector, confirming whether the sector in programming is the last sector address or not, if the sector in programming is not the last sector address, increasing the sector address and then proceeding to the step to check whether the sector has been protected or not, and if it is the last sector address, finishing the byte program; checking whether the sector for erase has been protected or not, and if it has been protected proceeding to the step to check whether the sector address in erase is the last sector address or not, and if it has not been protected performing a chip erase; if any fail occurs during the chip erase, finishing the test mode, and if not checking whether the sector address in erase is the last sector address or not; as a result of checking whether it is the last sector address or not, if it is not the last sector address, increasing the sector address and then proceeding to the step to check whether the sector for performing the chip erase has been protected or not; and as a result of checking whether it is the last sector address or not, if it is the last sector address, restarting the test mode.

BRIEF DESCRIPTION OF THE DRAWINGS

The above object, and other features and advantages of the present invention will become more apparent by describing the preferred embodiment thereof with reference to the accompanying drawings, in which.

DETAILED DESCRIPTION OF PREFERRED EMBODIMENT

One preferred embodiment of the present invention will be below explained by reference to the accompanying drawings.

Figure 1:
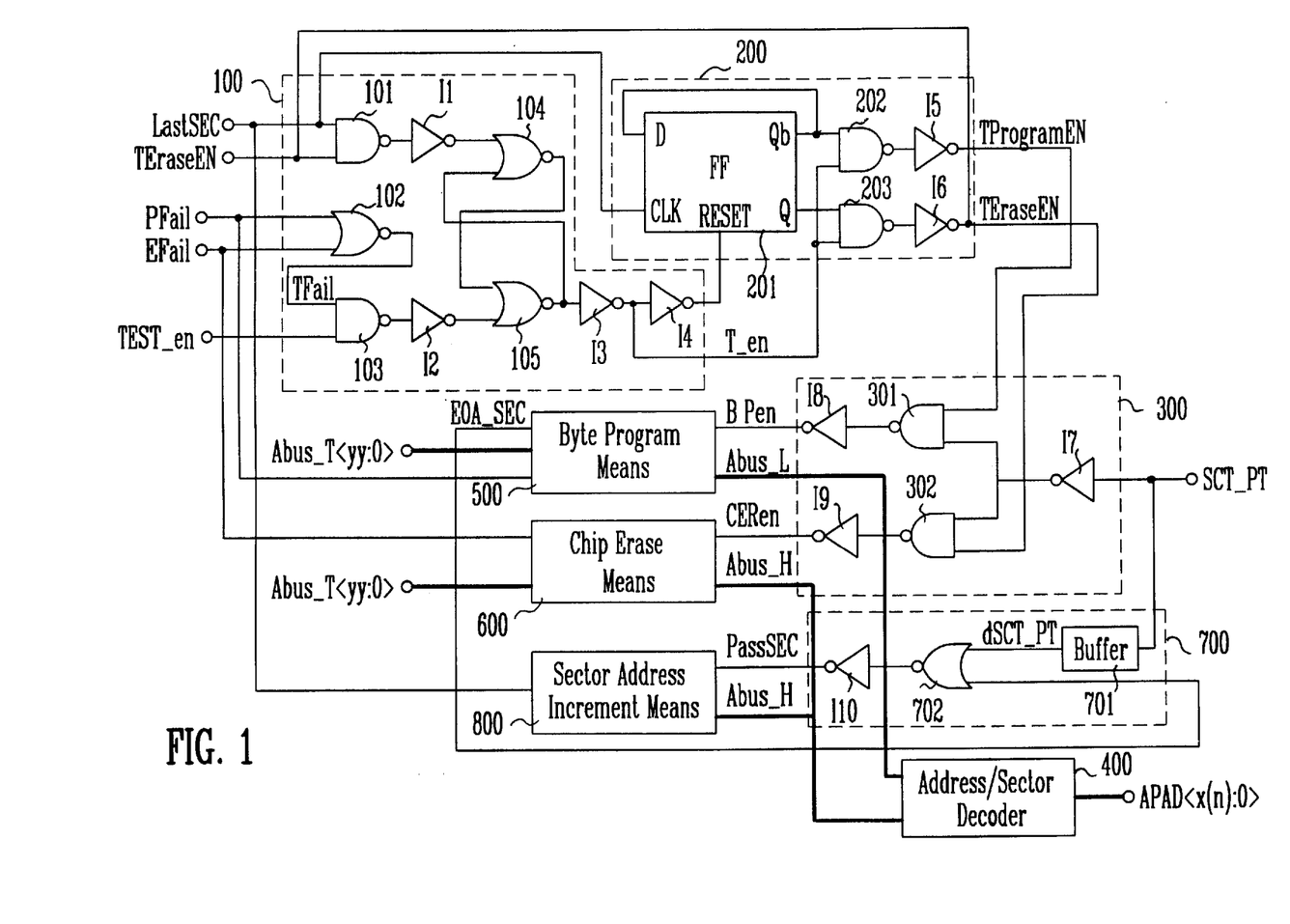
FIG. 1 is a circuit diagram for illustrating the test circuit for a flash memory device according to the present invention.

FIG. 1 is a circuit diagram for illustrating the test circuit for a flash memory device according to the present invention.

The test circuit for the flash memory device according to the present invention applies a specific voltage to more than one pins, thus entering a non-stop cycling test mode. Thus, it activates the test enable signal TEST_en, which enables the test circuit. The test circuit includes a first means (test signal T_en) generating means 100, a second means (program/erase determining means 200) for determining whether it performs a test program operation or a test erase operation according to the test signal T_en and sector address, a third means (program/erase mode progress determining means 300) for selecting a byte program mode or a chip erase mode according to the value from the program/erase mode determining means 200 and whether the sector has been protected or not, an address/sector decoder 400 for decoding the address addr and sectors according to the address input to the address pad APAD, a byte program means 500 for performing a byte programming operation according to the output value from the program/erase mode progress determining means 300 and the address/sector decoder 400, a chip erase means 600 for performing a chip erase operation according to the output values from the program/erase mode progress determining means 300 and the address/sector decoder 400, a sector address increment determining means 700 for determining whether it should increase the sector address according to whether the sector has been protected and the sector address and a sector address increment means 800 for increasing the sector address according to the output from the sector address increment determining means 700. As the test enable signal TEST_en is activated only when a specific voltage is continuously applied to more than one pins, the operator does not need an additional works for test.

Figure 2:
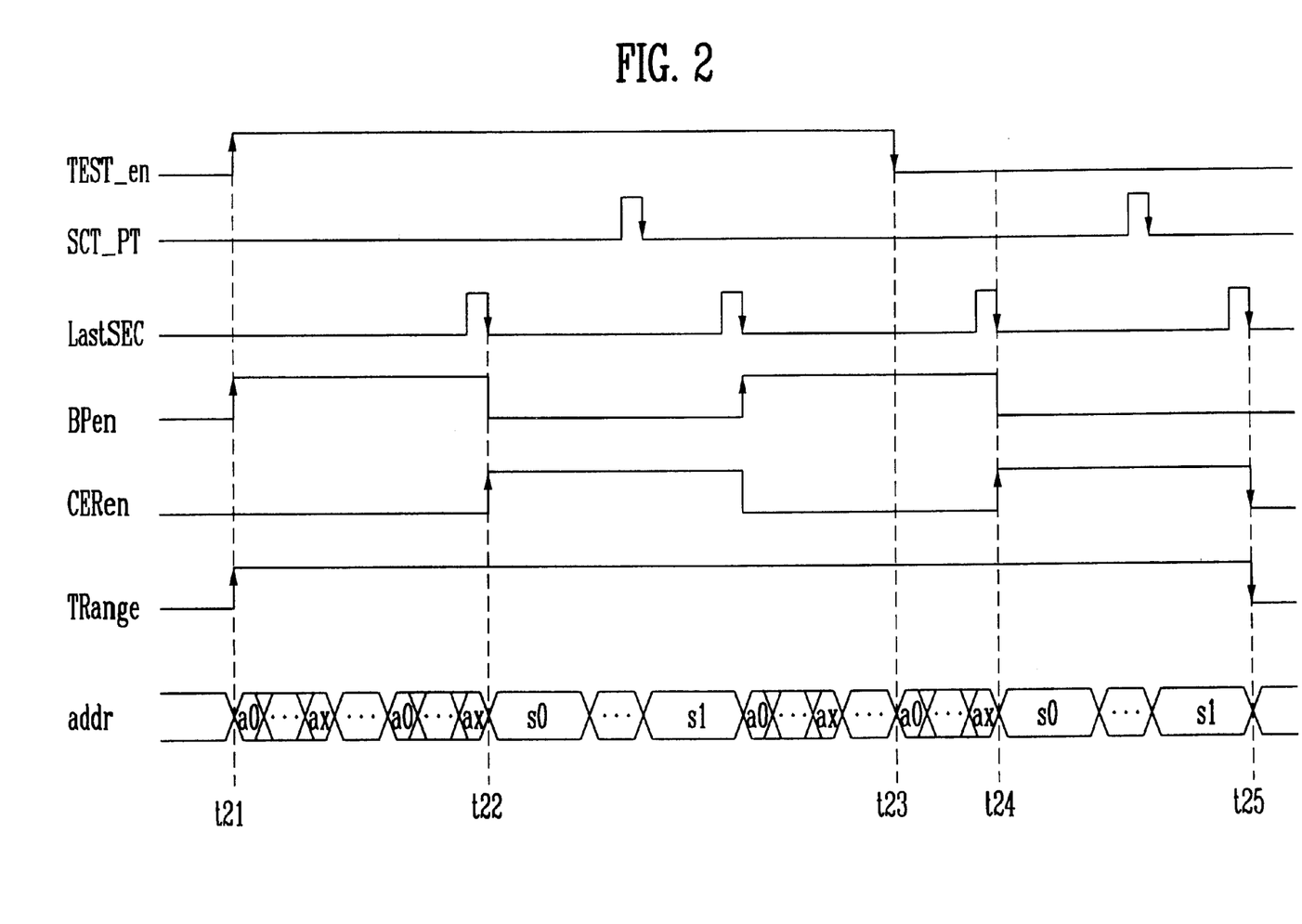
FIG. 2 is a waveform of respective signals shown to explain the operation of a test circuit according to the present invention, where any sectors are protected.

Next, in FIG. 2, there is shown a waveform of respective signals shown to explain the operation of a test circuit according to the present invention, where any sectors are protected.

In the drawing, even though the test enable signal TEST_en transfers to an inactive state due to a disable of a specific voltage application or other reasons (time t23), the non-stop cycling test mode continues until the test on the operation in progress is finished (time t25). This can be more flexibly used according to the circuit designer. For example, the activation period and the test period TRange of the test enable signal TEST_en can be made same. In other words, if the test enable signal TEST_en is inactivated, the non-stop test mode has to be disabled.

Then, the operation of the test signal generating means 100 will be explained after the test enable signal TEST_en is activated.

When a constant voltage is applied to a specific pin from outside, the last sector address signal LastSEC and the test erase enable signal TEraseEN become a LOW state. Thus, the output value of the first logic means 101 becomes a HIGH state. Also, as the program fail signal PFail and the erase fail signal EFail become a HIGH state, the output value of the second logic means 102 becomes a HIGH state. Then, the output value of the third logic means 103 using the test fail signal TFail being the output signal from the second logic means 102 and the test enable signal TEST_en as inputs, becomes a LOW state. Thus, the output value of the first logic means 101 is inverted via the first inverter I1 and then outputted as a HIGH state through the fourth logic means 104. Also, the output value of the third logic means 103 is inverted via the second inverter I2 and the outputted as a LOW state through the fifth logic means I2. The output value of the fifth logic means is inverted via the third inverter I3, which then generates a test signal T_en of a HIGH state. Then, the signal inverted by the fourth inverter I4 becomes a driving signal of the program/erase mode determining means 200. At this time, the first and third logic means 101, 103 are logic means which output a LOW state only when both the input values thereof are HIGH states. For example, they may be consisted of NAND gates. Also, the second, fourth and fifth logic means 102, 104 and 105 are logic means which output a HIGH state only when all the input values thereof are LOW states. For example, they may be consisted of NOR gates.

The program/erase mode determining means 200 includes a flip-flop circuit 201, a seventh means 203 for inputting the first output value Q from the flip-flop circuit 201 and the test signal T_en, and a sixth logic means 202 for inputting the second output value Qb being an inverted value of the first output value from the flip-flop circuit 201 and the test signal T_en) etc. When the flip-flop circuit 201 is reset by the inverted signal of the test signal T_en, the second output value Qb of the flip-flop circuit 201 becomes a HIGH state and the output value of the sixth logic means 202 becomes a LOW state. Meanwhile, the first output value Q of the flip-flop circuit 201 becomes a LOW state and the output value of the seventh means 203 becomes a HIGH state. Then, the output value of the sixth logic means 202 is inverted by the fifth inverter I5. Thus, the test program enable signal TProgramEN becomes a HIGH state, whereas the test erase enable signal TEraseEN becomes a LOW state. The test program enable signal TProgramEN and the test erase enable signal TEraseEN input the program/erase progress determining means 300 along with the sector protection signal SCT_PT.

At this time, only when the input values of the sixth and seventh logic means 202 and 203 are LOW states, it outputs a HIGH state. For example, it may be consisted of a NAND gate.

The eighth logic means 301 of the program/erase mode progress determining means 300 inputs the sector protection signal SCT_PT inverted via the seventh inverter I7 and the test program enable signal TProgramEN to output a LOW value. On the other hand, the ninth logic means 302 inputs the sector protection signal SCT_PT inverted via the seventh inverter I7 and the test erase enable signal TEraseEN to output a HIGH value. The output value of the eighth means 301 is inverted by the eighth inverter I8, which causes the byte program enable signal BPen to be a HIGH state, and the output value of the ninth means 302 is inverted by the ninth inverter I9, which maintains the chip erase enable signal CEREn to be a LOW state (t21). At the time, the eighth and ninth logic means 301 and 302 are circuits which output a HIGH state only which both the input value thereof are LOW states. For example, they may be consisted of NAND gates.

When an address APAD<x(n):0> is input from the address pad APAD, the address/sector decoder 400 decodes it depending on its memory and then performs a program/erase mode along with the byte program enable signal BPen and the chip erase enable signal CERen.

Then, the lower bus Abus_L of the address bus outputted from the address/sector decoder 400 has an address for byte program and the higher bus Abus_H of the address bus has a sector address for chip erase.

As the program enable signal BPen is at HIGH state, the byte program means 500 increases the address of one selected sector while it performs a program in byte unit. If any fail does not occur in the selected sector, the program fail signal PFail keeps at a LOW state.

As the chip erase enable signal CERen is at a LOW state, the chip erase means 600 does not performs any operation and the erase fail signal EFail keeps at a LOW state.

The sector address increment determining means 700 inputs the last address signal EOA_SEC and the sector protection signal SCT_PT of the sector to determine whether it should increase the sector address. At this time, during the byte program, the buffer 701 keeps the current sector protection information and then the tenth logic means 702 compares it with the last address signal EOA_SEC of the sector. Next, the tenth inverter I10 inverts it to generate a sector fail signal PassSEC. At present, the sector is not protected. At this time, when the byte program is finished for the one selected sector, the last address signal EOA_SEC of the sector becomes a LOW state. Therefore, the output value of the tenth logic means 702 becomes a HIGH state. In this case, as a LOW value is input to the sector address increment means 800, the sector address does not increase. On the other hand, when the byte program is finished for the current sector, the last address signal EOA_SEC of the sector becomes a HIGH state. Therefore, the output value of the ten logic means 702 becomes a LOW state. In this case, as a HIGH value is input to the sector address increment means 800, the sector address does increase. The sector address increment means 800 functions to inform that the point is located at the last sector for toggle of the test program enable signal TProgramEN and the test erase enable signal TEraseEN.

Figure 3:
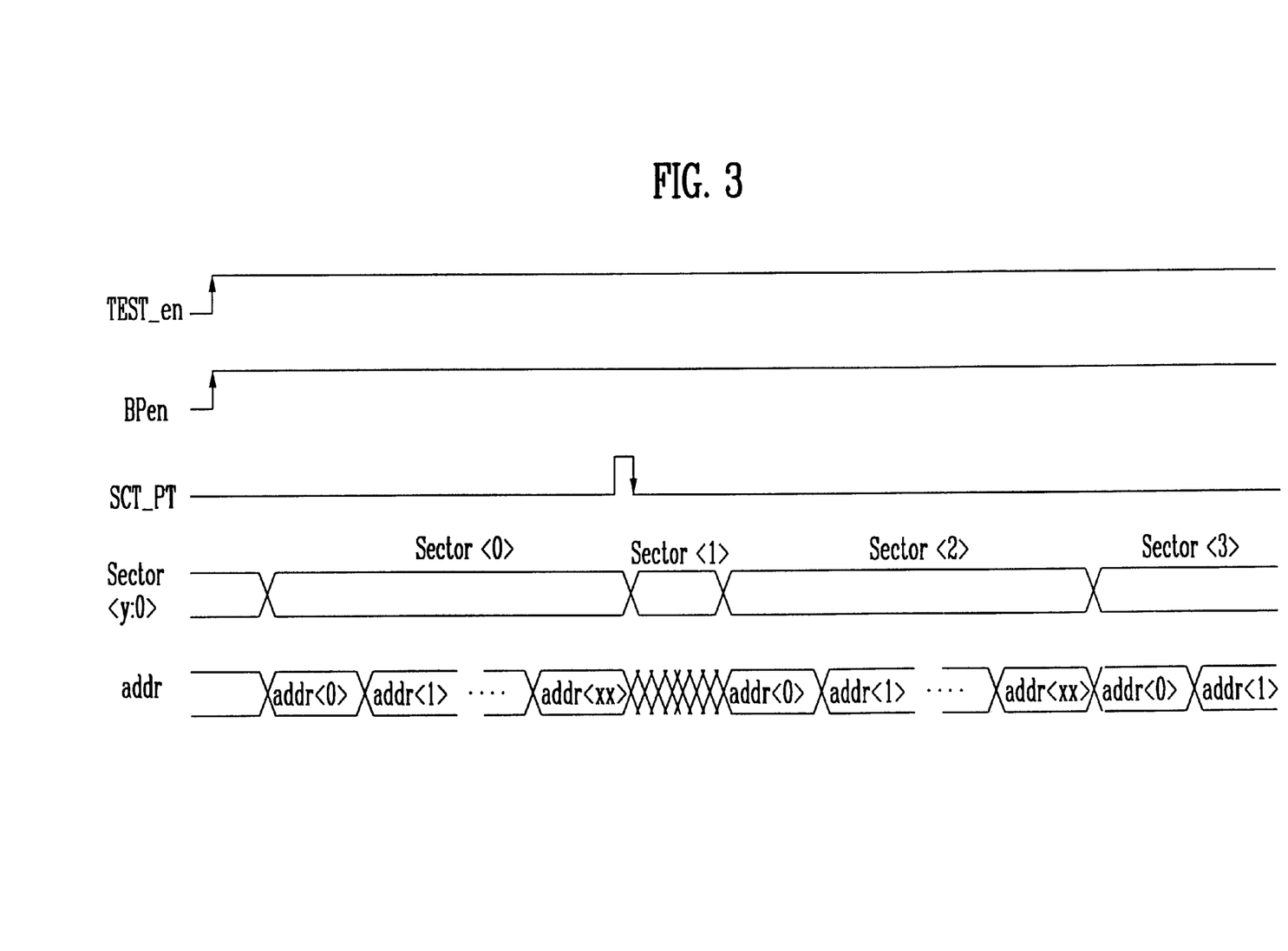
FIG. 3 is a waveform of major signals shown to explain the byte program process of a test circuit according to the present invention, where any sectors are protected.

FIG. 3 is a waveform of major signals shown to explain the byte program process of a test circuit according to the present invention, where any sectors are protected. The waveform in the drawing shows that the sector <1> is protected.

The byte program operation is finished by the above method, the last sector address signal LastSEC of the output value from the sector address increment means 800 becomes temporarily a HIGH state. Thereby, the first output Q value of the flip-flop circuit 201 within the program/erasure mode determining means 200 has a HIGH state, the second output Qb value thereof has a HIGH state. Therefore, the test program enable signal TProgramEN becomes a LOW state while the test erasure enable signals TEraseEN has a HIGH state. If the sector protection signal SCT_PT has a LOW state for the current sector, the byte program enable signal BPen becomes a LOW state while the chip erasure enable signal CERen becomes a HIGH state. The chip erasure means 600 increases its sector address depending on the sector address Abus_H which is decoded and inputted from the address/sector decoder 500 while performing a chip erase operation (t22).

Figure 4:
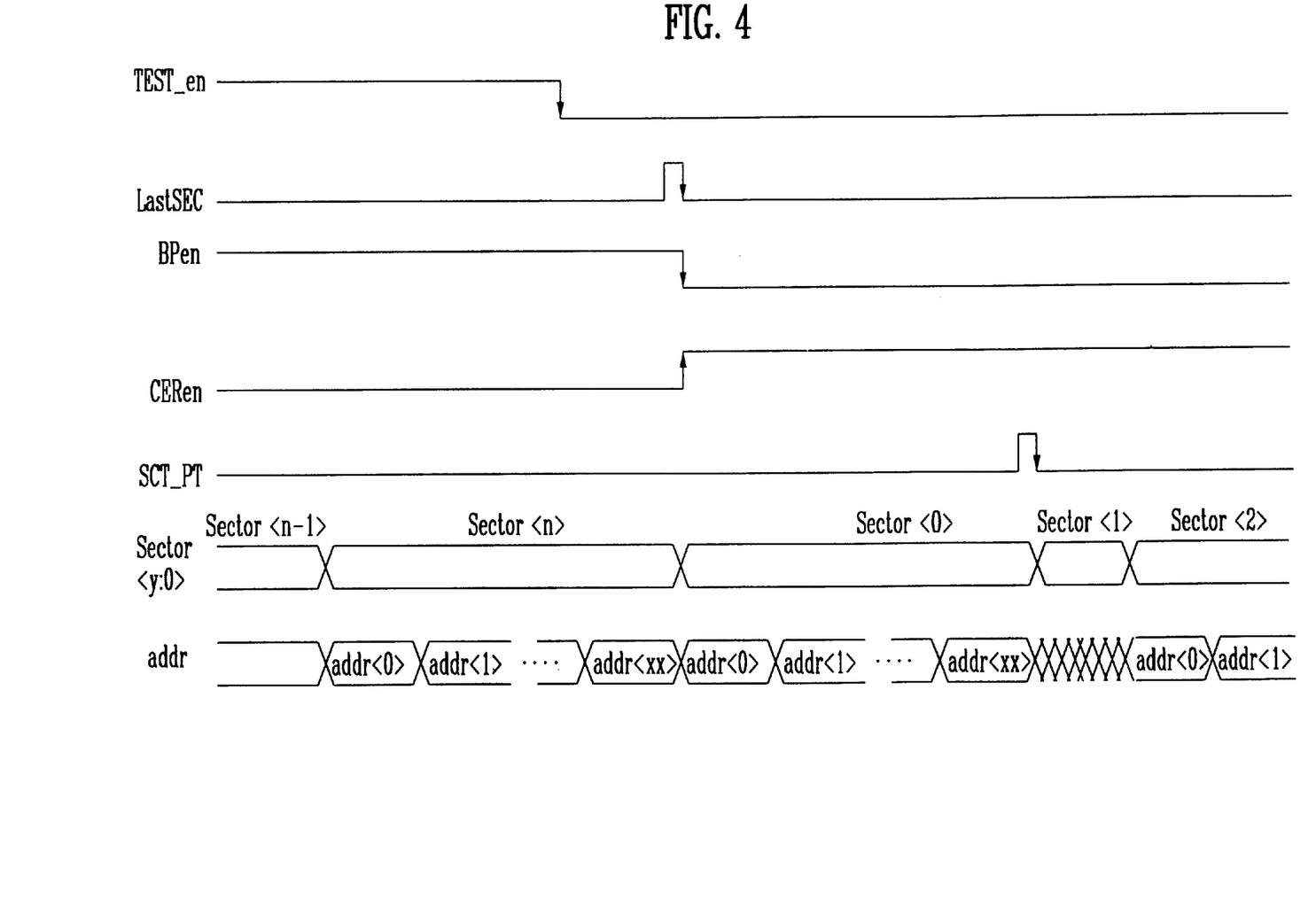
FIG. 4 is a waveform of respective signals shown to explain the chip erase process of a test circuit according to the present invention where any sectors are protected.

FIG. 4 is a waveform of major signals shown to explain the end (since t24 in FIG. 2) of the chip erase process of a test circuit according to the present invention where any sectors are protected. The waveform in the drawing shows that the sector <1> is protected.

When any protected sectors are found during the byte program or the chip erasure process, in other words, if the sector protection signal SCT_PT has a HIGH state, the circuit will operate as follows.

When any one of the eighth and ninth logic means 301 and 302 in the program/erase mode progress determining means 300 outputs a LOW value, the program mode or the erase mode may be performed. However, if the sector protection signal SCT_PT becomes a HIGH state, both the eighth and ninth logic means 301 and 302 will output HIGH values regardless of the test program enable signal TProgramEN and the test erase enable signal PEraseEN. Therefore, the byte program means 500 and the chip erase means 600 will not operate. Also, in the sector address increment determining means 700, as the sector protection signal dSEC_PT delayed by the buffer will maintain a HIGH state regardless of the last address signal EOA_SEC, the output value of the tenth logic means 702 will output a LOW value and thus the sector address thereof will be increased by the sector address increment means 800.

The above mentioned program and erase process is performed for the entire sectors which were not protected, and also will be performed automatically and repeatedly until the test enable signal TEST_en becomes a LOW state (t23). If any fail will occur in them before the test enable signal TEST_en become a LOW state, the circuit will operate as follows.

If any fails occur when the byte program means 500 performs the byte program, the byte program means 500 will have the program fail signal PFail become a HIGH state. If any fails occur when the chip erase means 600 performs a chip erase process, the chip erase means 600 will have the erase fail signal EFail become a HIGH state. If any one of the program fail signal PFail and the erase fail signal EFail has a HIGH state, the third logic means 103 of the test signal generating means 100 will output a HIGH value. Thus, the test signal T_en being the output value of the test signal generating means 100 will become a LOW state, which will have both the test program enable signal TProgramEN and the test erase enable signal TEraseEN become LOW states. Thus, the non-stop cycling test mode will stop.

Figure 5:
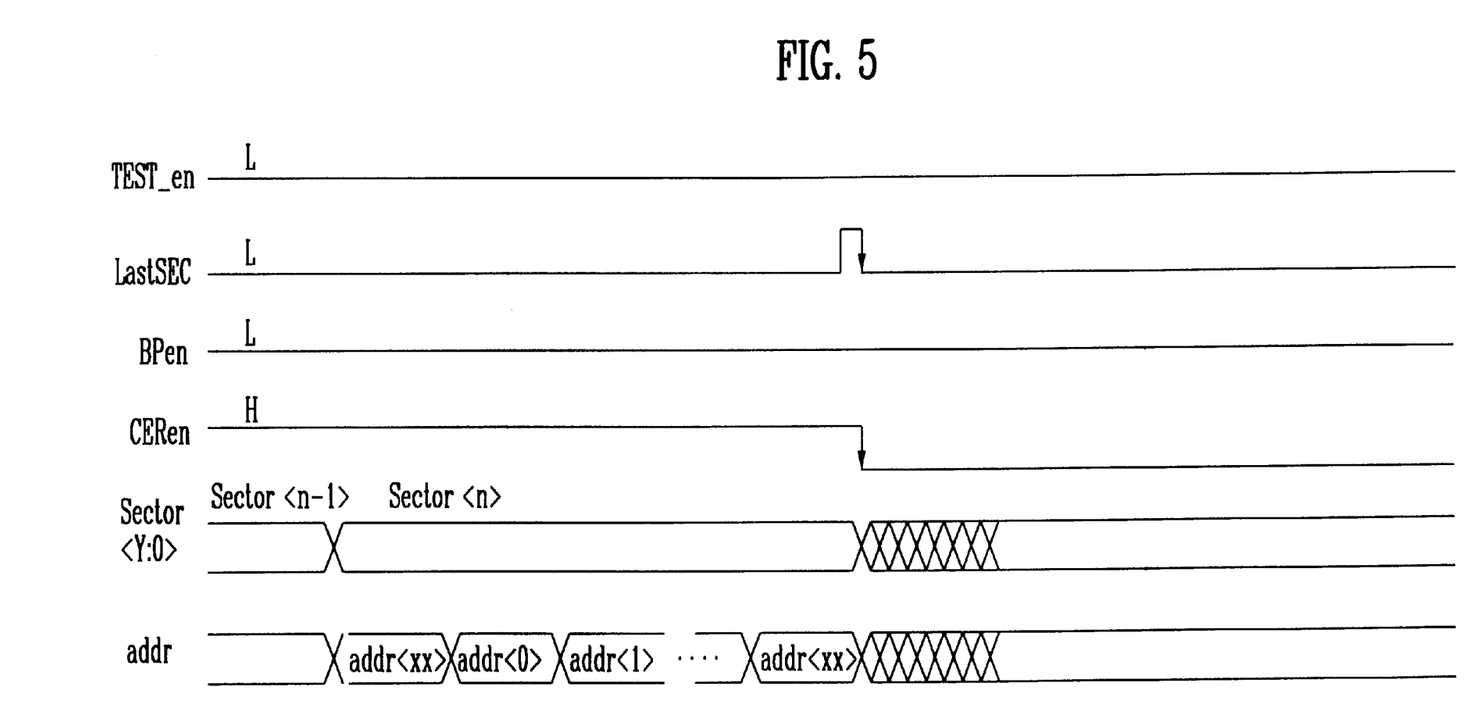
FIG. 5 is a waveform of respective signals shown to explain the byte program and sector erase process of a test circuit according to the present invention where any sectors are protected.

As above, even when any fail in the chip occur, the test result can be seen only with the test fail signal TFail being stopped at that time without latching its information. If the test fail signal TFail becomes a HIGH state, the fail address Abus_T<yy:0> outputted from the byte program means 500 and the chip erase means 600 will be used as a defective flag. This address will means that where the fail occurred into which the sector and the address are incorporated. This is also used a reference material in a subsequent repair process. However, if the test fail signal TFail is inactive, the fail address value Abus_T<yy:0> has nothing to mean FIG. 5 is a waveform of major signals shown to explain the byte program and sector erase process of a test circuit according to the present invention where any sectors are protected (see the waveform since t24 in FIG. 2).

The non-stop cycling test mode using the test circuit for the flash memory device according to the present invention will transfer automatically to the erase operation after completing the programming into the entire sectors that were not protected. This is made possible by the last sector address signal LastSEC which informs that programming or erase operation is performed for the last sector. Thus, an automatic transfer will be performed from the programming operation into the erase operation or vice versa. These operations will be repeated to time t25 where the test period signal TRange become inactive.

Figure 6:
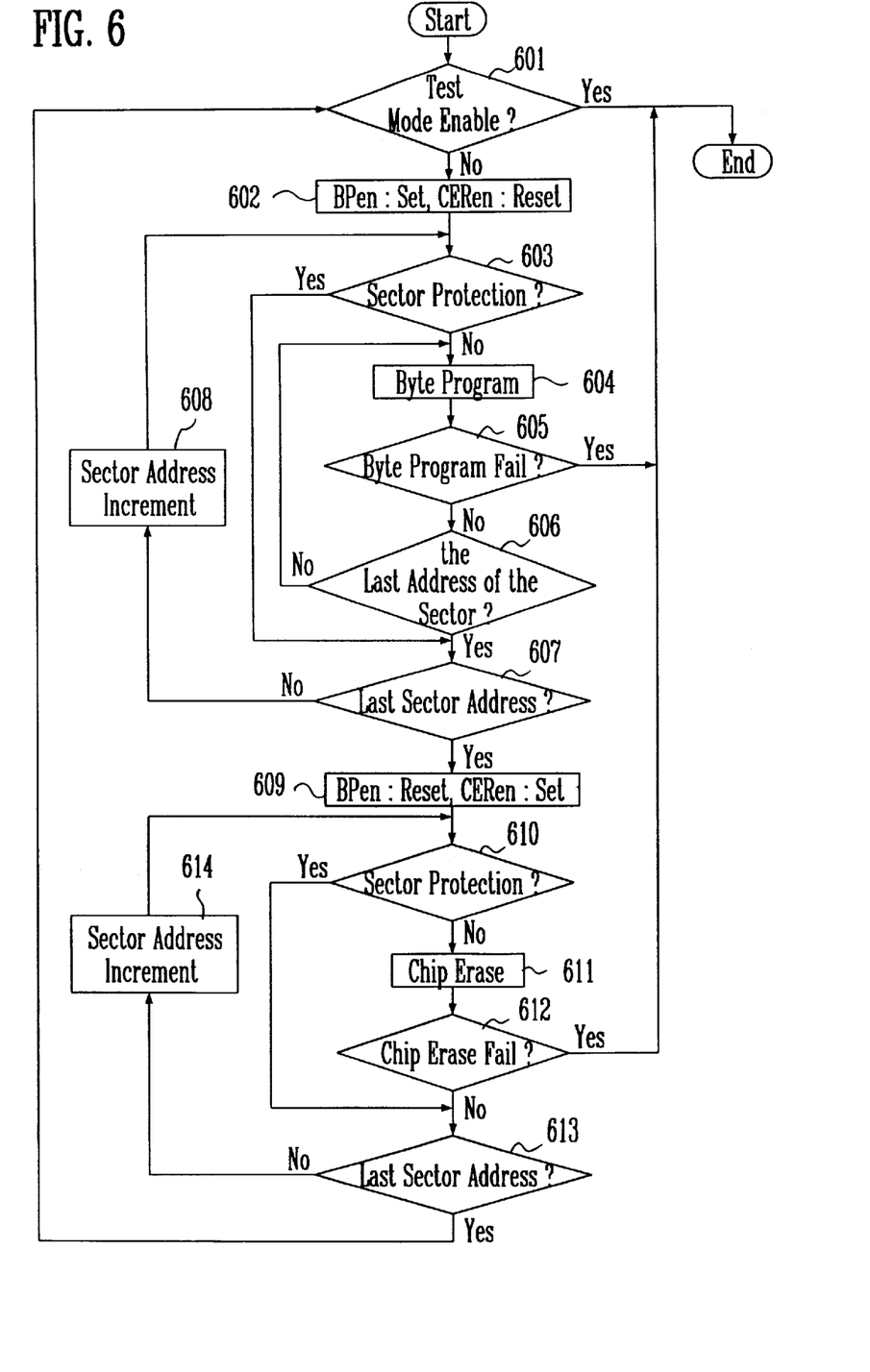
FIG. 6 is a flowchart for illustrating the test method using the test circuit for a flash memory device according to the present invention.

FIG. 6 is a flowchart for illustrating the test method using the test circuit for a flash memory device according to the present invention. First, it confirm whether it is the test mode (step 601). If not, it finish it. However, if it is the test mode, it sets the byte program enable signal BPen while it resets the chip erase enable signal CEREn (step 602). Then, it checks whether the sector to which the byte program will be performed has been protected or not (step 603). If it has been protected, it checks whether the sector address to be programmed is the last sector address or not (step 607). However, it the sector was not protected, it performs the byte program (step 604). Next, it checks whether any fail occurs during the byte program or not (step 605). If the fail has occurred, it finishes. If it is not, it checks whether the address of the current sector to which the programming is performed is the last address of the sector (step 606). As a result of the check, if it is not the last address of the sector, it proceeds to the byte program process (step 604) to continue the programming. If it is the last address of the sector, it checks whether the address of the sector to be programmed is the last sector address or not (step 607). As a result of the check, if it is the last sector address, it increases the sector address (step 608) to perform the byte program and then proceeds to the process (step 603) to check whether the sector for programming has been protected or not (step 603). If it is not the last sector address, it resets the byte program enable signal BPen and sets the chip erase enable signal CEREn (step 609). Thereafter, it checks whether the sector to be erased has been protected or not (step 610). Then if is protected, it proceeds to the process (step 613) to check the current sector address being erased is the last sector address or not. If it is not protected, it performs the chip erase process (step 611) and confirms whether any fail has occurred during the chip erase (step 612). If any fail has occurred, it finishes the test mode. If not, it checks whether it is the last sector address or not (step 613). As the result of checking it, it is not the last sector address, it increases the sector address to continue the chip erase (step 614) and proceeds to the process (step 610) to check whether the sector for erase has been protected. However, it is the last sector address, it proceeds to the process (step 601) to check whether it is the test mode or not then to perform continuously the non-stop cycling test mode.

As described above, according to the present invention, it can perform the test mode simply by checking a defective flag since a given period of cycle while testing a plurality of chips. Here, as the given period of cycle can be controlled by the time when a specific voltage is applied to a given pin, it allows a sufficient variation of the test operation. Then, the test operator only checks the defective flag of the last result since the automatic byte program and the chip erase operation will be continued without stop during a given cycle after it enters the test mode. If any fail in the chip is found during the test, the defective flag will be remained only on the corresponding chip. Thus, the related information on the defective chips, that is the sector and address in which the fail is found, will be handed over to the repair process. Thus, the test circuit according to the present invention has the advantages that it will short the progress speed of the test process and will reduce the costs required.

While the present invention has been described and illustrated herein with reference to the preferred embodiment thereof, it will be understood by those skilled in the art that various changes in form and details may be made therein without departing from the spirit and scope of the invention.

What is claimed is:

1. A test circuit for a flash memory device, comprising:
   a byte program means for performing a byte program according to a byte program enable signal and a cell address signal and outputting the last address signal of a sector, a program fail signal and an address signal of the fail cell;
   a chip erase means for performing a chip erase operation according to an erase enable signal and said sector address signal and for outputting an erase fail signal and an address signal of a fail sector;
   a sector address increment means for increasing a sector address according to said sector address signal and outputting the last sector address signal;
   a first means for generating a test signal according to the test enable signal, said last sector address signal, a test erase enable signal, said program fail signal and said erase fail signal;
   a second means for generating a test program enable signal or a test erase enable signal according to the last sector address signal and the test signal to supply them to said byte program means or said chip erase means; and
   an address/sector decoder for decoding the address from an address pad into a cell address and a sector address to supply them said byte program means and said chip erase means, respectively.

2. The test circuit for a flash memory device as claimed in claim 1, further comprising a third means for checking whether a specific sector of the flash memory device to be tested has been protected or not and for inactivating said byte program means and said chip erase means.

3. The test circuit for a flash memory device as claimed in claim 1, wherein said first means is consisted of a logic combination of a means for outputting a test signal if any fail does not occur during the test and for outputting an inverted signal of said test signal if any fail occur during the test, according to the last sector address signal, the test erase enable signal, the program fail signal, the erase fail signal and the test enable signal.

4. The test circuit for a flash memory device as claimed in claim 1, wherein said second means is consisted of a logic combination of a means for outputting alternatively the test program enable signal and the test erase enable signal if any fail does not occur during the test and for not outputting the test program enable signal and the test erase enable signal if any fail occurs during the test, according to the last sector address signal and the test signal.

5. The test circuit for a flash memory device as claimed in claim 2, wherein said third means is consisted of a logic combination of a means for outputting any one of the byte program mode enable signal and the chip erase mode enable signal if the sector has not been protected and for not outputting the byte program mode enable signal and the chip erase mode enable signal if the sector has been protected, according to the test program enable signal, the test erase enable signal and the sector protection signal.

6. A method of test a flash memory device, comprising the steps of:
   confirming whether the current sector has been protected or not as the test mode begins, if it has been protected, checking whether is the last address of the sector or not, and if not performing a byte programming operation;

if any fail occurs during the byte programming operation, finishing the test mode, and if it is not, checking whether the address in programming is the last address of the sector, and if it is not the last address of the sector, proceeding to the step to check whether the sector has been protected, and if it is the last address of the sector, confirming whether the sector in programming is the last sector address or not;

if the sector in programming is not the last sector address, increasing the sector address and then proceeding to the step to check whether the sector has been protected or not, and if it is the last sector address, finishing the byte program;

checking whether the sector for erase has been protected or not, and if it has been protected proceeding to the step to check whether the sector address in erase is the last sector address or not, and if it has not been protected, performing a chip erase;

if any fail occurs during the chip erase, finishing the test mode, and if not checking whether the sector address in erase is the last sector address or not;

as a result of checking whether it is the last sector address or not, if it is not the last sector address, increasing the sector address and then proceeding to the step to check whether the sector for performing the chip erase has been protected or not; and as a result of checking whether it is the last sector address or not, if it is the last sector address, restarting the test mode.

\* \* \* \* \*